United States Patent
Ueno et al.

(10) Patent No.: US 8,906,162 B2
(45) Date of Patent: Dec. 9, 2014

(54) METAL ORGANIC CHEMICAL VAPOR DEPOSITION EQUIPMENT

(75) Inventors: Masaki Ueno, Itami (JP); Toshio Ueda, Itami (JP); Eiryo Takasuka, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/360,366

(22) Filed: Jan. 27, 2012

(65) Prior Publication Data

US 2012/0118234 A1 May 17, 2012

Related U.S. Application Data

(62) Division of application No. 11/822,188, filed on Jul. 3, 2007.

(30) Foreign Application Priority Data

Jul. 5, 2006 (JP) ................................. 2006-185740

(51) Int. Cl.
| | |
|---|---|
| C23C 16/50 | (2006.01) |
| C23C 16/00 | (2006.01) |
| C23F 1/00 | (2006.01) |
| H01L 21/306 | (2006.01) |
| C30B 35/00 | (2006.01) |
| C23C 16/30 | (2006.01) |
| C30B 25/16 | (2006.01) |
| C23C 16/455 | (2006.01) |

(52) U.S. Cl.
CPC ..... *C23C 16/45585* (2013.01); *C23C 16/45504* (2013.01); *C30B 35/00* (2013.01); *C23C 16/303* (2013.01); *C30B 25/165* (2013.01)
USPC .......................................... 118/725; 118/728

(58) Field of Classification Search
CPC ................... C23C 16/45585; C23C 16/45559; C23C 16/45504
USPC ....... 118/715, 722, 723 R, 723 MW, 723 AN, 118/723 E, 723 ER, 723 IR, 725, 728; 156/345.29, 345.33, 345.34, 345.35, 156/345.36, 345.38, 345.39, 345.4, 345.41, 156/345.43

See application file for complete search history.

(56) References Cited

U.S. PATENT DOCUMENTS 4,297,162 A * 10/1981 Mundt et al. .................. 438/729
4,651,673 A * 3/1987 Muething ..................... 118/725

(Continued)

FOREIGN PATENT DOCUMENTS

| EP | 0 559 326 A1 | 9/1993 |
| EP | 1 184 489 A2 | 3/2002 |

(Continued)

OTHER PUBLICATIONS

English Machine Translation of JP2006287256A. Performed and printed on Feb. 19, 2014 from http://www4.ipdl.inpit.go.jp/Tokujitu/PAJdetail.ipdl?N0000=60&N0120=01&N2001=2&N3001=2002-359203.*

(Continued)

*Primary Examiner* — Parviz Hassanzadeh
*Assistant Examiner* — Tiffany Nuckols
(74) *Attorney, Agent, or Firm* — McDermott Will & Emery LLP

(57) ABSTRACT

Metal organic chemical vapor deposition equipment is metal organic chemical vapor deposition equipment for forming a film on a substrate by using a reactant gas, and includes a susceptor heating the substrate and having a holding surface for holding the substrate, and a flow channel for introducing the reactant gas to the substrate. The susceptor is rotatable with the holding surface kept facing an inner portion of the flow channel, and a height of the flow channel along a flow direction of the reactant gas is kept constant from a position to a position, and is monotonically decreased from the position to the downstream side. It is thereby possible to improve film formation efficiency while allowing the formed film to have a uniform thickness.

6 Claims, 7 Drawing Sheets

(56) References Cited

U.S. PATENT DOCUMENTS

| | | | |
|---|---|---|---|
| 4,993,360 A | 2/1991 | Nakamura | |
| 6,214,116 B1* | 4/2001 | Shin | 118/640 |
| 6,218,212 B1 | 4/2001 | Saito et al. | |
| 6,666,921 B2* | 12/2003 | Sakai et al. | 118/715 |
| 6,929,830 B2* | 8/2005 | Tei et al. | 427/575 |
| 2002/0160112 A1* | 10/2002 | Sakai et al. | 427/255.28 |
| 2008/0276958 A1* | 11/2008 | Mehta et al. | 134/1.2 |

FOREIGN PATENT DOCUMENTS

| | | |
|---|---|---|
| EP | 1 220 305 A1 | 7/2002 |
| JP | 2-291113 | 11/1990 |
| JP | 2-291114 | 11/1990 |
| JP | 04-338636 | 11/1992 |
| JP | 6-216030 | 8/1994 |
| JP | 08-335558 | 12/1996 |
| JP | 2002-261021 A | 9/2002 |

OTHER PUBLICATIONS

European Search Report issued in corresponding European Patent Application No. 07011616.5-1215, mailed on Dec. 31, 2007.
Japanese Office Action, with English Translation, issued in Japanese Patent Application No. JP 2006-185740, mailed on May 20, 2008.
Korean Grounds for Rejection, w/ English translation thereof, issued in Korean Patent Application No. KR 10-2007-0067270 dated Nov. 28, 2008.

* cited by examiner

POSITION ALONG FLOW DIRECTION OF REACTANT GAS

POSITION ALONG FLOW DIRECTION OF REACTANT GAS

DISTANCE FROM SUSCEPTOR END IN FLOW DIRECTION OF REACTION GAS (mm)

DISTANCE FROM CENTER OF SUSCEPTOR (mm)

US 8,906,162 B2

METAL ORGANIC CHEMICAL VAPOR DEPOSITION EQUIPMENT

RELATED APPLICATIONS

This application is a Divisional of U.S. application Ser. No. 11/822,188, filed on Jul. 3, 2007, claiming priority of Japanese Patent Application No. 2006-185740, filed on Jul. 5, 2006, the entire contents of each of which are hereby incorporated by reference.

BACKGROUND OF THE INVENTION

1. Field of the Invention

The present invention relates to metal organic chemical vapor deposition equipment, and particularly relates to metal organic chemical vapor deposition equipment for forming a nitride semiconductor layer.

2. Description of the Background Art

A Metal Organic Chemical Vapor Deposition (MOCVD) method is one of the typical chemical vapor deposition methods, in which a Group III organic metal is vaporized and then thermally decomposed at a surface of a substrate, and reacted with a Group V gas to form a film. This method enables control of a film thickness and a composition, and is excellent in productivity, so that it is widely used as a film formation technique in manufacturing semiconductor equipment.

MOCVD equipment used in the MOCVD method includes a chamber, a susceptor disposed in the chamber, and a conduit for allowing a reactant gas to flow at a surface of a substrate. In the MOCVD equipment, a film is formed by holding the substrate on the susceptor, heating the substrate to an appropriate temperature while bringing the chamber into a reduced pressure state, and introducing an organic metal gas to the surface of the substrate through a conduit. At this time, in order that the formed film has a uniform thickness, the MOCVD equipment is required to allow the reactant gas to flow uniformly along the surface of the substrate. To do so, various shapes of conduits have been proposed in the MOCVD equipment.

As conventional MOCVD equipment, Japanese Patent Laying-Open No. 2-291113, for example, discloses chemical vapor deposition equipment having an introduction pipe introducing a reactant gas to above a substrate. The introduction pipe has a sample holding chamber accommodating a susceptor therein, a bottleneck portion having a cross-sectional shape long along a width direction of the substrate and short and flat along a height direction of the substrate, and blowing a reactant gas onto the substrate from a side of the substrate, and a guide portion located above the substrate and uniformly covering the substrate on its top side with a gap approximately equal to a width of the bottleneck portion in a width direction or with a gap decreased toward a downstream side of the reactant gas so as to guide the reactant gas along the surface of the substrate. The susceptor is fixed to the sample holding chamber, and holds the substrate on the downstream side of a reactant gas flow.

Furthermore, Japanese Patent Laying-Open No. 6-216030, for example, discloses compound semiconductor chemical vapor deposition equipment having a flow channel for introducing a reactant gas onto a substrate. The flow channel has a taper, a width of which in a height direction is decreased from an upstream side to a downstream side. A susceptor is fixed to a lower part of the taper.

Moreover, Japanese Patent Laying-Open No. 2-291114 discloses chemical vapor deposition equipment including a rotary susceptor for holding a substrate, and a liner pipe for introducing a reactant gas to the substrate. The liner pipe has a height monotonically decreased over the entire channel for introducing the reactant gas.

The MOCVD equipment is required to improve film formation efficiency. Upsizing of the susceptor enables formation of a large-diameter substrate as well as simultaneous heating of multiple substrates, and hence film formation efficiency would be improved. However, upsizing of the susceptor increases a distance between an upstream side and a downstream side of the susceptor, resulting in that the conditions of the reactant gas (e.g. a concentration, a temperature and the like of the reactant gas) between the upstream side and the downstream side of the susceptor are significantly different. As a result, there arises a problem of nonuniform thickness of a formed film. As such, it is not conventionally possible to improve film formation efficiency while allowing the formed film to have a uniform thickness.

SUMMARY OF THE INVENTION

Accordingly, an object of the present invention is to provide MOCVD equipment capable of improving film formation efficiency while allowing a formed film to have a uniform film thickness.

MOCVD equipment according to the present invention is metal organic chemical vapor deposition equipment for forming a film on a substrate by using a reactant gas, and includes: a heating component heating the substrate and having a holding surface for holding the substrate; and a flow channel for introducing the reactant gas to the substrate. The heating component is rotatable with the holding surface kept facing an inner portion of the flow channel. A height of the flow channel along a flow direction of the reactant gas is kept constant from an upstream side lateral end of a position for holding the substrate at the holding surface to an arbitrary position of the holding surface, and is monotonically decreased from the arbitrary position to a downstream side.

In the MOCVD equipment according to the present invention, the reaction rate of the reactant gas is increased from the arbitrary position to the downstream side. It is thereby possible to obtain an approximately linear relation between the position of the holding surface along the flow direction of the reactant gas and the reaction rate of the reactant gas. As a result, by rotating the heating component, it is possible to allow the film formed on the substrate to have a uniform thickness. Furthermore, there is no need to uniformize the reactive conditions of the reactant gas on the upstream side and the downstream side of the heating component, so that it is possible to upsize the heating component and improve film formation efficiency.

Note that the "height of the flow channel" in the specification of the present application means a length of an inner space of the flow channel in a direction of a normal to the holding surface of the heating component.

Preferably, in the MOCVD equipment according to the present invention, monotonic decrease in height of the flow channel terminates at a position located on the downstream side of a position located on an upstream side of a downstream side lateral end of the substrate holding position by 2%.

If the height of the flow channel along the flow direction of the reactant gas is monotonically decreased from the arbitrary position to the downstream side, the reaction rate of the reactant gas may significantly be decreased on the downstream side of a position near the position where monotonic decrease terminates. Accordingly, by terminating the monotonic decrease at the position located on the downstream side of the position located on the upstream side of the downstream side lateral end of the substrate holding position by 2%, it is possible to obtain a linear relation between the substrate holding position along the flow direction of the reactant gas and the reaction rate of the reactant gas.

Note that the "position located on the upstream side . . . by 2%" in the specification of the present application means a position located on the upstream side by 2% of a length of the holding surface in the flow direction (a diameter of the holding surface).

Preferably, in the MOCVD equipment according to the present invention, the monotonic decrease in height of the flow channel terminates at any of a position of the downstream side lateral end and a position located on the downstream side of the position of the downstream side lateral end.

It is therefore possible to obtain a linear relation between the substrate holding position along the flow direction of the reactant gas and the reaction rate of the reactant gas.

Preferably, in the MOCVD equipment according to the present invention, a height of the flow channel along a width direction is monotonically decreased at the holding surface from each end portion to a central portion of the holding surface.

Preferably, in the MOCVD equipment according to the present invention, the height of the flow channel along the width direction is monotonically decreased in a curved manner.

Accordingly, the reaction rate of the reactant gas at the central portion of the holding surface is increased, so that it is possible to provide a uniform reaction rate in the width direction of the flow channel.

Note that the "width direction of the flow channel" in the specification of the present application means a direction perpendicular to both of the height direction of the flow channel and the flow direction of the reactant gas.

Preferably, in the MOCVD equipment according to the present invention, the flow channel has a bottleneck portion on an upstream side of the arbitrary position, and the height of the flow channel along the flow direction of the reactant gas at the bottleneck portion is once decreased and then increased.

It is thereby possible to increase the growth rate at the upstream side of the arbitrary position to be approximately the same as that on the downstream side of the arbitrary position. As a result, it is possible to grow a uniform film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will hereinafter be described with reference to the drawings.

First Embodiment

Figure 1:
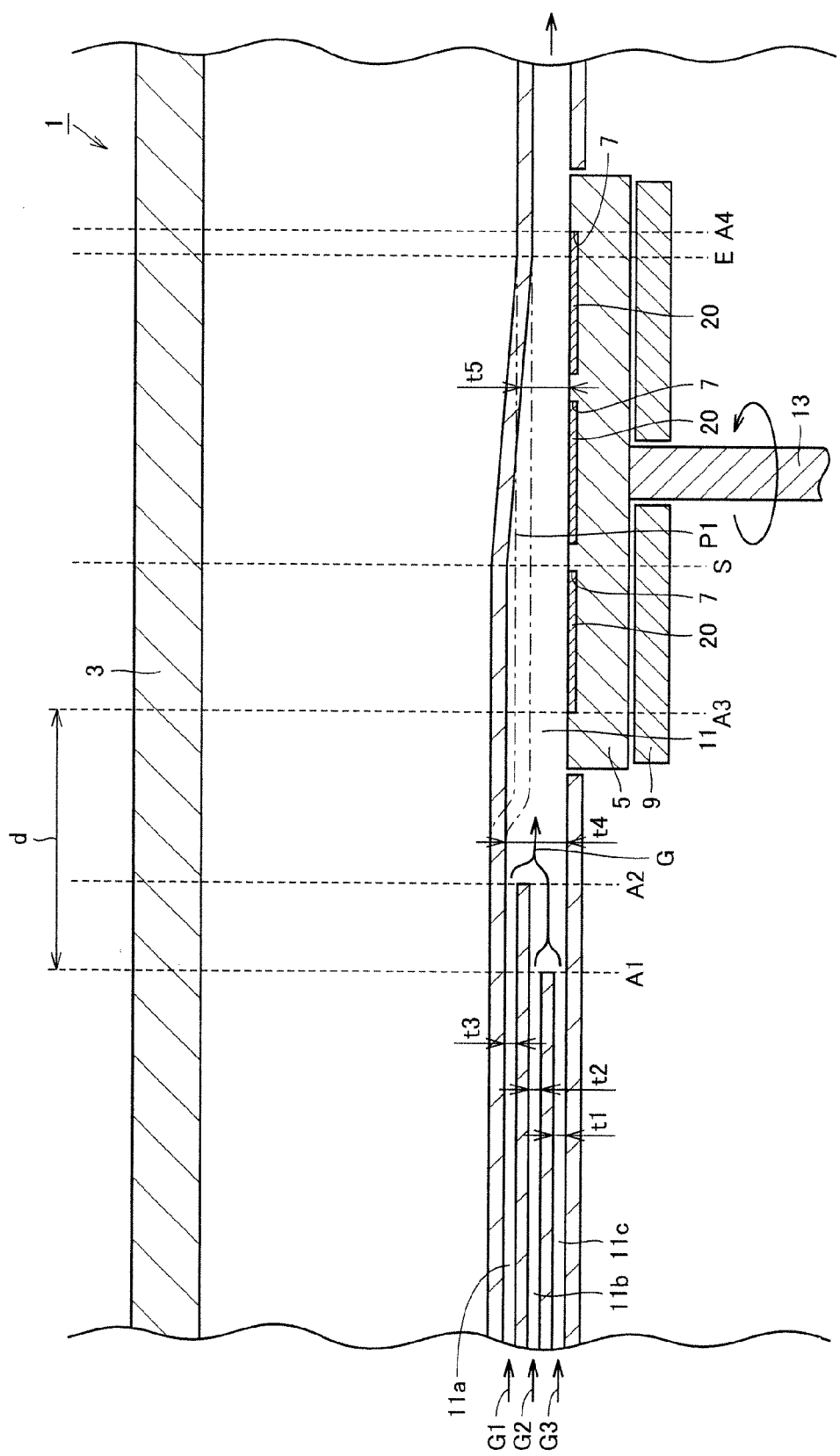
FIG. 1 is a cross sectional view showing a configuration of MOCVD equipment according to a first embodiment of the present invention.
Figure 2:
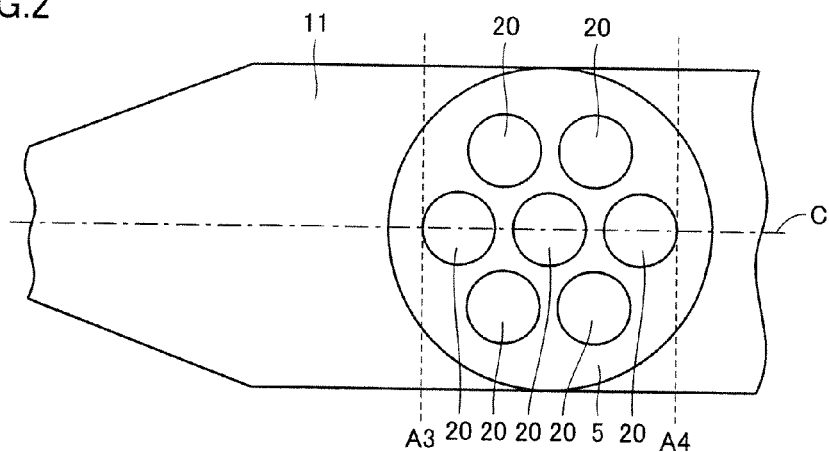
FIG. 2 is a plan view showing a periphery of a susceptor in FIG. 1.

Referring to FIGS. 1 and 2, MOCVD equipment 1 according to the present embodiment includes a chamber 3, a susceptor 5 serving as a heating component, a heater 9, and a flow channel 11. Susceptor 5, heater 9, and flow channel 11 are placed in chamber 3. Flow channel 11 extends in a transverse direction in FIG. 1. A holding surface (a top surface in FIG. 1) of susceptor 5 faces an inner portion of flow channel 11.

Susceptor 5, which has a disk shape, is placed on heater 9, which also has a disk shape. A rotary shaft 13 is attached to a lower part of susceptor 5, so that susceptor 5 is rotatable with the holding surface thereof kept facing the inner portion of flow channel 11. A plurality of concave portions 7, each having a circular shape in a plan view, are formed in the holding surface of susceptor 5. Substrates 20 are held in concave portions 7, respectively, and hence substrates 20 are heated. Referring to FIG. 2, in particular, seven concave portions 7 are formed in the holding surface of susceptor 5, and circular substrates 20 are held in the concave portions 7, respectively.

Flow channel 11 is a horizontal-type, three-laminar-flow system, and extends in parallel with the holding surface of susceptor 5. In other words, flow channel 11 is divided into a plurality of flow channels 11a-11c on an upstream side (on the left side in FIG. 1). A boundary between flow channels 11b and 11c terminates at a position A1, while a boundary between flow channels 11a and 11b terminates at a position A2. A width of flow channel 11 is increased at a constant rate from the upstream side to a position immediately before a position A3 described later (FIG. 2). Flow channels 11a-11c have heights t3, t2 and t1, respectively. It is preferable that a height t4 of flow channel 11 within a range from position A2 to position A3 satisfies t4≥t1+t2+t3.

In MOCVD equipment 1, the plurality of substrates 20 are held at the holding surface of susceptor 5, and susceptor 5 is heated by heater 9 and rotated. Gases G1-G3, which are to constitute a reactant gas, are introduced through flow channels 11a-11c, respectively. The reactant gas flows to the right in FIG. 1. For example, assume the case where a Group III-V nitride semiconductor layer is formed. As gas G1, there is used a purge gas such as a hydrogen ($H_2$) gas or a nitrogen ($N_2$) gas. As gas G2, there is used a mixed gas of an organic metal gas containing a Group III element such as trimethyl gallium (TMG), trimethyl indium (TMI), or trimethyl aluminum (TMA), and a carrier gas such as an $H_2$ gas or an $N_2$ gas. As gas G3, there is used a mixed gas of a gas containing a Group V element such as an ammonia ($NH_3$) gas and a carrier gas such as an $H_2$ gas or an $N_2$ gas. When these gases G1-G3 are introduced, mixing of gas G2 and gas G3 is initiated at position A1, and mixing with the purge gas is further initiated at position A2, so that a reactant gas G is constituted. Mixed gas G is then introduced above susceptor 5 in parallel with the holding surface and diffused, and heated by susceptor 5. The organic metal gas contained in mixed gas G is decomposed by being heated and turns into an intermediate reactant, which reacts with ammonia and turns into a nitride semiconductor. As a result, a nitride semiconductor layer is formed on a surface of substrate 20.

Figure 3:
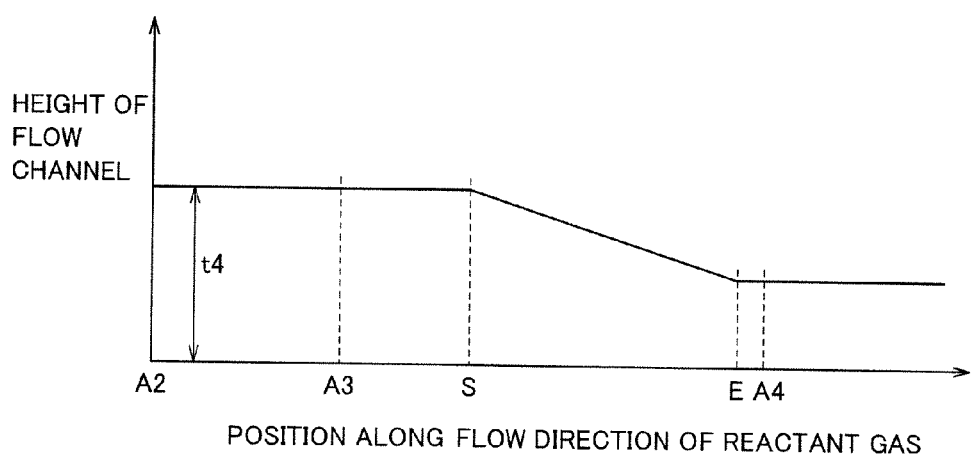
FIG. 3 is a graph showing a relation between a position along a flow direction of a reactant gas and a height of a flow channel in the first embodiment of the present invention.

In MOCVD equipment 1, a height of flow channel 11 along a flow direction of the reactant gas is changed at a position of the holding surface of susceptor 5. Referring to FIGS. 1-3, an upstream side lateral end of a position for holding substrate 20 at the holding surface of susceptor 5 is referred to as position A3, while a downstream side lateral end thereof is referred to as a position A4. The height of flow channel 11 is constant from position A2 to an arbitrary position S of the holding surface beyond position A3, is monotonically decreased (linearly decreased) from position S to position E toward the downstream side (a portion shown by a height t5 in FIG. 1), and becomes constant again in a region located on the downstream side of position E (a region including position A4).

In FIG. 3, position E, where monotonic decrease terminates, is located on the upstream side of position A4. However, position E is preferably located on the downstream side of a position located on an upstream side of position A4 by 2%, and more preferably located on the same position as position A4 or on the downstream side of position A4.

The inventors of the present invention have found that, with MOCVD equipment 1, it is possible to improve film formation efficiency while allowing a formed film to have a uniform thickness. This will hereinafter be described.

Figure 4:
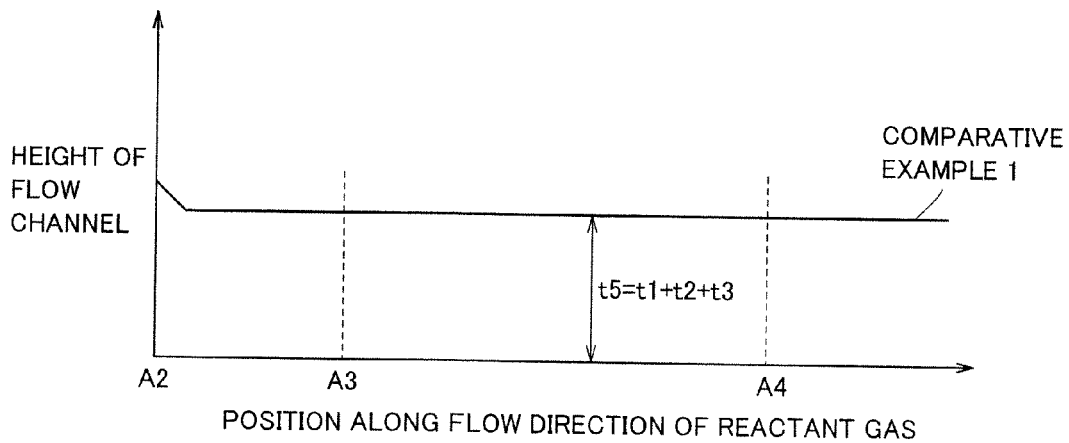
FIG. 4 is a graph showing a relation between a position along a flow direction of a reactant gas and a height of a flow channel in Comparative Example 1.
Figure 5:
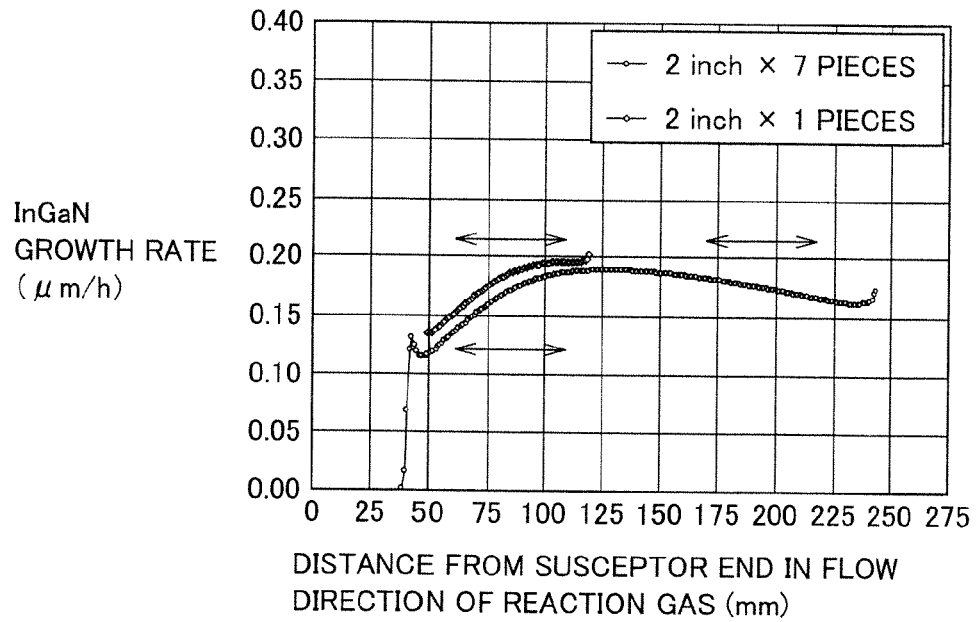
FIG. 5 is a graph showing a relation between a distance from an upstream side end portion of the susceptor along the flow direction of the reactant gas and an InGaN growth rate when an InGaN layer is formed with the use of the MOCVD equipment in Comparative Example 1, with the susceptor not rotated.

Initially, the inventors of the present invention prepared MOCVD equipment (Comparative Example 1) which includes a flow channel having height t4 decreased on the upstream side of position A3 and having height t5 kept constant from position A3 to position A4 (t5=t1+t2+t3), as shown by a dashed-dotted line P1 in FIG. 1 and FIG. 4, and a susceptor having the shape in FIG. 2. This MOCVD equipment was then used to form an InGaN layer, which is identified as a semiconductor nitride layer, on a surface of the substrate with the susceptor not rotated. There was examined the relation between a distance from the upstream side lateral end of the susceptor along a flow direction of the reactant gas, and an InGaN growth rate. The results are shown in FIG. 5. Note that the results in FIG. 5 are the ones obtained along a center line (a line C in FIG. 2) of the susceptor in its width direction, and that a range shown by an arrow in FIG. 5 represents a position for holding the substrate at the holding surface of the susceptor. For comparison, there are also shown the results in the case where one 2-inch substrate was held in equipment having the size of a flow channel and the size of a susceptor reduced in a geometrically similar manner such that one 2-inch substrate can be held therein.

Referring to FIG. 5, the InGaN growth rate at the susceptor, where seven substrates were held, is significantly increased from 0 at a position approximately 40 mm apart from the upstream side lateral end (i.e. a starting position of the susceptor), and assumes a maximum value at a position approximately 125 mm apart from the upstream side lateral end, and is then moderately decreased. The InGaN growth rate in the case where one substrate was held is monotonically increased in general.

As to the results in FIG. 5, the reason why the growth rate is significantly increased from 0 at the position apart from approximately 40 mm from the upstream side lateral end seems to be that the reactant gas is required to move above the susceptor to a certain extent so as to initiate the reaction between a Group III element and a Group V element. The reason why the growth rate assumes a maximum value is that a boundary layer is developed as diffusion of a raw material is promoted toward the downstream side, and hence a concentration gradient is once increased and then becomes moderate. The results in FIG. 5 further show that, when the susceptor is not rotated, the reactive conditions are significantly different between the upstream side and the downstream side of the reactant gas, owing to the upsizing of the susceptor.

Figure 6:
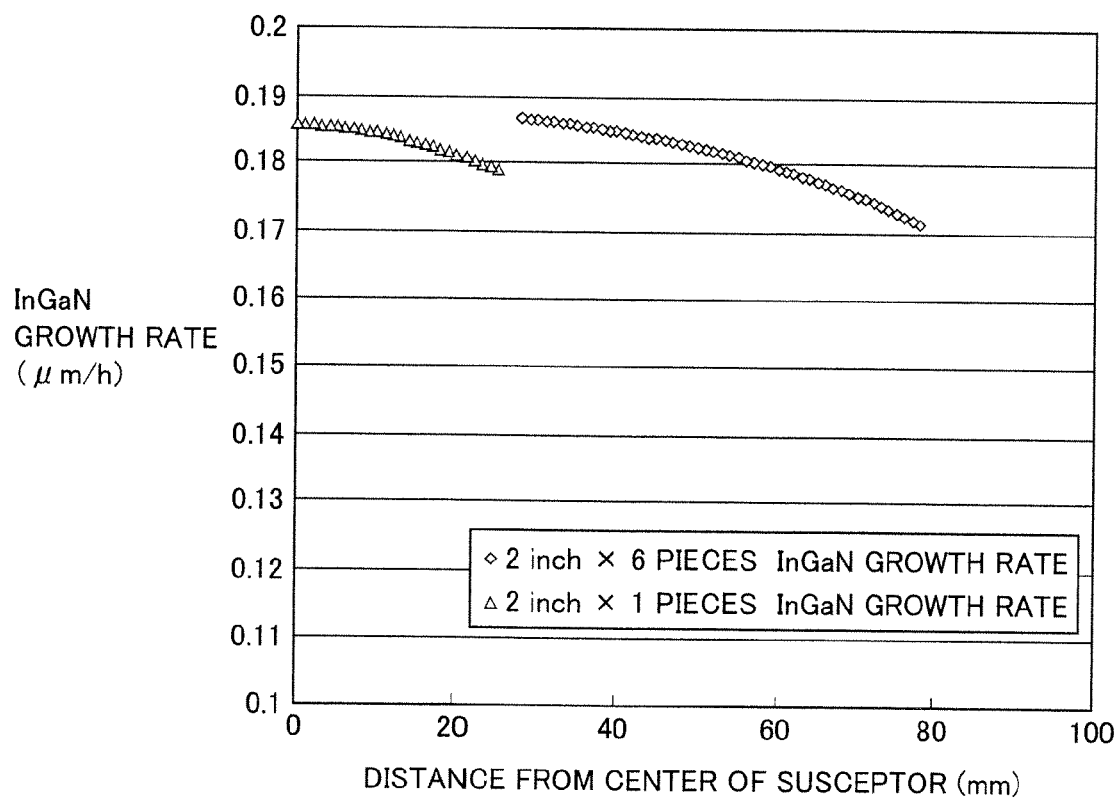
FIG. 6 is a graph showing a relation between a distance from the center of the susceptor and an InGaN growth rate when an InGaN layer is formed with the use of the MOCVD equipment in Comparative Example 1, with the susceptor rotated.

Next, the inventors of the present invention used the MOCVD equipment in Comparative Example 1 so that an InGaN layer was formed on the surface of the substrate with the susceptor rotated. Note that six substrates were held at the susceptor such that the center of each of the substrates was located at a position 53 mm apart from the center of the susceptor. There was examined the relation between a distance from the center of the susceptor and an InGaN growth rate. The results are shown in FIG. 6. For comparison, there are also shown the results in the case where one 2-inch substrate was held in the equipment of a size capable of holding one 2-inch substrate. Furthermore, a distribution width of the InGaN growth rate in the substrate is shown in Table 1.

TABLE 1

|  | Case Where 6 Substrates are Held | Case Where 1 Substrate is Held |
|---|---|---|
| Distribution Width of InGaN Growth Rate | ±4.3% | ±1.8% |

Referring to FIG. 6 and Table 1, rotation of the susceptor allows the InGaN growth rate distribution to be averaged and improved. However, the distribution width of the InGaN growth rate obtained when one substrate was held is ±1.8%, whereas the distribution width of the InGaN growth rate obtained when six substrates were held is ±4.3%. This reveals that even when the susceptor is rotated, a thickness of the formed film becomes nonuniform owing to upsizing of the susceptor. It is also revealed that in any of the case where one substrate is held and the case where six substrates are held, the InGaN growth rate is decreased on an outer diameter side of the susceptor.

Assume the case where a film is formed on the substrate with the susceptor rotated. If the relation between a position of the holding surface along a flow direction of the reactant gas and a reaction rate of the reactant gas is made linear (made to be a proportional relation), it is possible to form a film having a uniform thickness at the substrate. In other words, when the susceptor is rotated, there is no need to uniformize the reactive conditions of the reactant gas on the upstream side and the downstream side of the susceptor.

The inventors of the present invention thus fabricated MOCVD equipment 1 (Example 1 of the present invention) according to the present embodiment shown in FIG. 1 so as to improve the InGaN growth rate in FIG. 5 on the downstream side of the susceptor and obtain an approximately linear relation between a position of the holding surface along a flow direction of the reactant gas and the reaction rate of the reactant gas. In Example 1 of the present invention, the position in FIG. 5 where the InGaN growth rate assumes a maximum value (a position at 125 mm) is set as position S where monotonic decrease initiates. Next, each of the MOCVD equipment in Example 1 of the present invention and Comparative Example 1 was used to form an InGaN layer on a surface of each of the six substrates held at the susceptor, with the susceptor rotated. There was examined a distribution width of the InGaN growth rate in the substrate, and the results thereof are shown in Table 2.

TABLE 2

|  | Comparative Example 1 | Example 1 of the Present Invention |
|---|---|---|
| Distribution Width of InGaN Growth Rate | ±4.3% | ±0.4% |

Referring to Table 2, the InGaN growth rate distribution in Comparative Example 1 is ±4.3%, whereas the InGaN growth rate distribution in Example 1 of the present invention achieves a small distribution width of ±0.4%. This reveals that, with MOCVD equipment 1 according to the present embodiment, it is possible to allow the formed film to have a uniform thickness even if the susceptor is upsized and films are simultaneously formed on multiple substrates.

In MOCVD equipment 1, position E, where monotonic decrease in height of flow channel 11 terminates, is preferably located on the downstream side of the position located on the upstream side of position A4 by 2%, and more preferably located at the same position as position A4 or on the downstream side of position A4. It is thereby possible to make linear the relation between the substrate holding position along a flow direction of the reactant gas and the reaction rate of the reactant gas. This will hereinafter be described.

Figure 7:
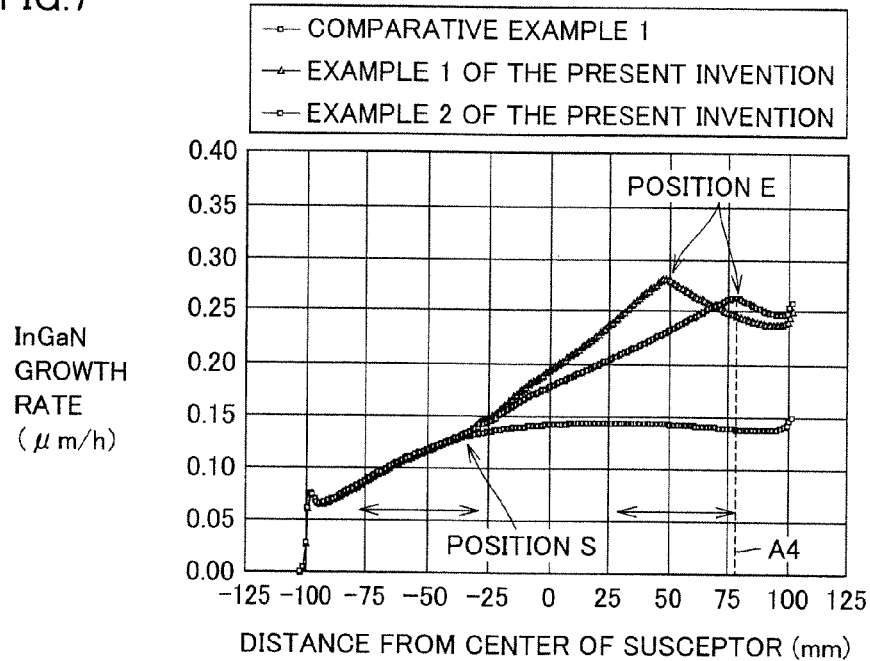
FIG. 7 is a graph showing a relation between a distance from the center of the susceptor and an InGaN growth rate when an InGaN layer is formed with the use of each of the MOCVD equipment in Example 1 of the present invention, Example 2 of the present invention, and Comparative Example 1.

The inventors of the present invention examined the effects of position E, where monotonic decrease in height of flow channel 11 terminates, on the growth rate. Specifically, as to the MOCVD equipment in FIG. 1, there were prepared equipment in which position E, where monotonic decrease terminates, is located on the upstream side of position A4 (Example 1 of the present invention) and equipment in which position E, where monotonic decrease terminates, is located at the same position as position A4 (Example 2 of the present invention). For comparison, there was prepared the MOCVD equipment in Comparative Example 1. Next, each of the MOCVD equipment in Example 1 of the present invention, Example 2 of the present invention, and Comparative Example 1 was used to form an InGaN layer on a surface of each of the six substrates held at the susceptor. There was examined the relation between a distance from the center of the susceptor and an InGaN growth rate, and the results thereof are shown in FIG. 7. Note that the results in FIG. 7 are the ones along the center line (line C in FIG. 2) in the width direction of the susceptor. A range shown by an arrow in FIG. 7 represents a position for holding the substrate at the holding surface of the susceptor.

Referring to FIG. 7, the InGaN growth rate is increased approximately linearly from the upstream side to the downstream side of the susceptor in Examples 1 and 2 of the present invention. However, the linear shape in Example 1 of the present invention is deformed at the substrate holding position on the right in the drawing, whereas the linear shape in Example 2 of the present invention is maintained up to the downstream side lateral end (position A4) of the substrate holding position. The results above show that, by locating termination position E at the same position as position A4 or on the downstream side of position A4, it is possible to make linear the relation between the substrate holding position along the flow direction of the reactant gas and the reaction rate of the reactant gas. It is also possible to obtain the similar effect if termination position E is located on the downstream side of the position located on the upstream side of position A4 by 2%.

In MOCVD equipment 1, it is preferable that a distance d between position A1, where the gases containing elements to constitute the nitride semiconductor layer are mixed, and position A3 is at least 50 mm and at most 100 mm. By locating position A1 apart from position A3 by at least 50 mm, diffusion of the Group III reactant gas and the Group V reactant gas is promoted near position A3, so that the reaction rate can be increased. By locating position A1 apart from position A3 by at most 100 mm, the reactant gas can be prevented from reacting in its vapor phase on the upstream side of position A3.

Second Embodiment

Figure 8:
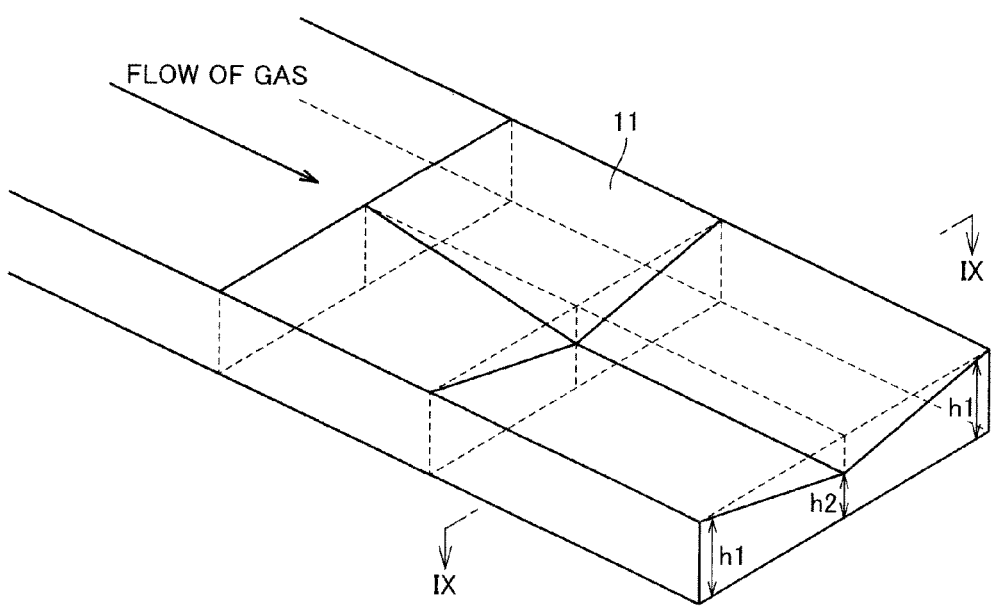
FIG. 8 is a perspective view showing a flow channel of MOCVD equipment according to a second embodiment of the present invention.
Figure 9:
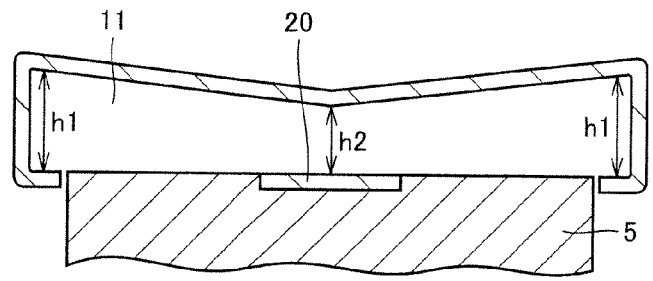
FIG. 9 is a cross sectional view taken along a line IX-IX in FIG. 8.
Figure 10:
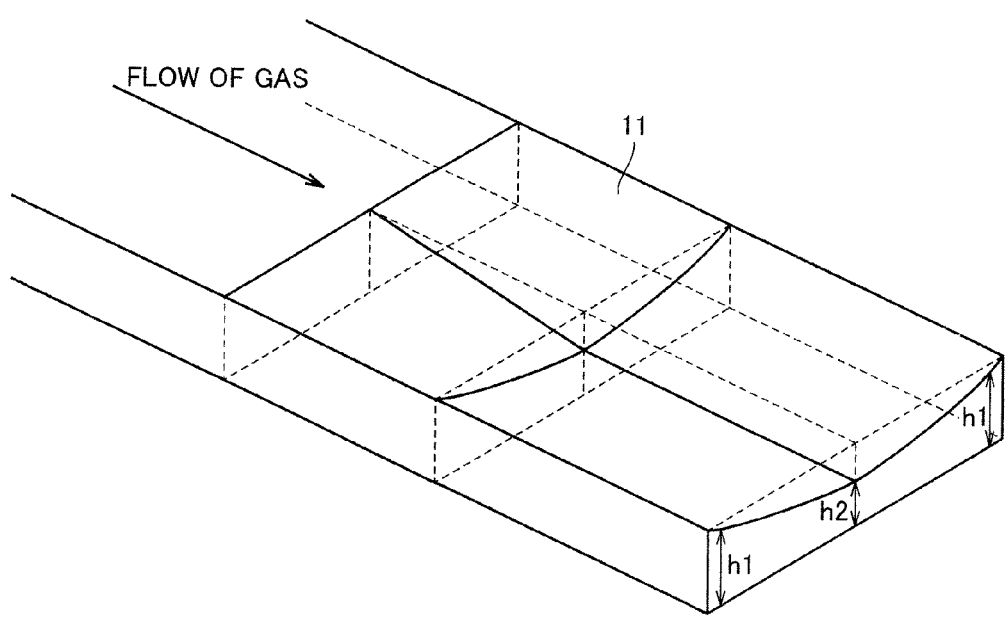
FIG. 10 is a perspective view showing a modification of the flow channel of the MOCVD equipment according to the second embodiment of the present invention.

Referring to FIGS. 8 and 9, in MOCVD equipment 1 according to the present embodiment, a height of flow channel 11 along the width direction thereof at the holding surface of susceptor 5 is monotonically decreased in a linear manner from each end portion (a height h1) to a central portion (a height h2) of the holding surface of susceptor 5. As shown in FIG. 10, the height of flow channel 11 along the width direction thereof at the holding surface of susceptor 5 may be monotonically decreased in a curved manner from each of the end portions (height h1) to the central portion (height h2) of the holding surface of susceptor 5. This causes an increase in reaction rate of the reactant gas at the central portion of the holding surface of susceptor 5, so that the reaction rate of flow channel 11 in the width direction thereof can be made uniformized.

Third Embodiment

Figure 11:
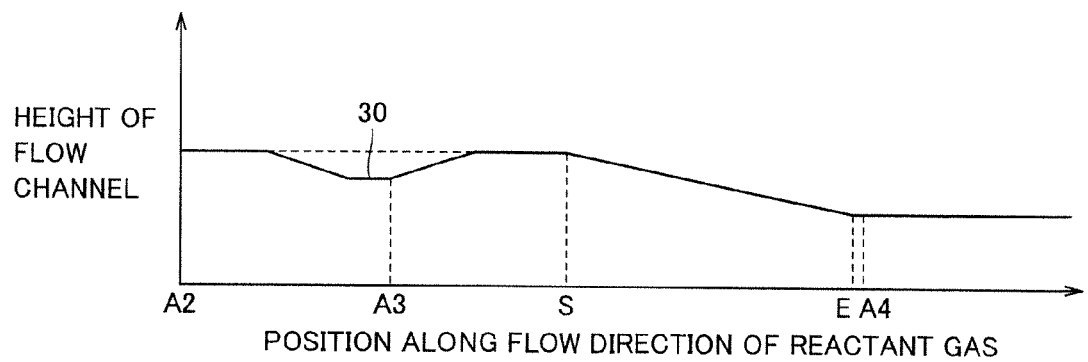
FIG. 11 is a graph showing a relation between a position along a flow direction of a reactant gas and a height of a flow channel in a third embodiment of the present invention.
Figure 12:
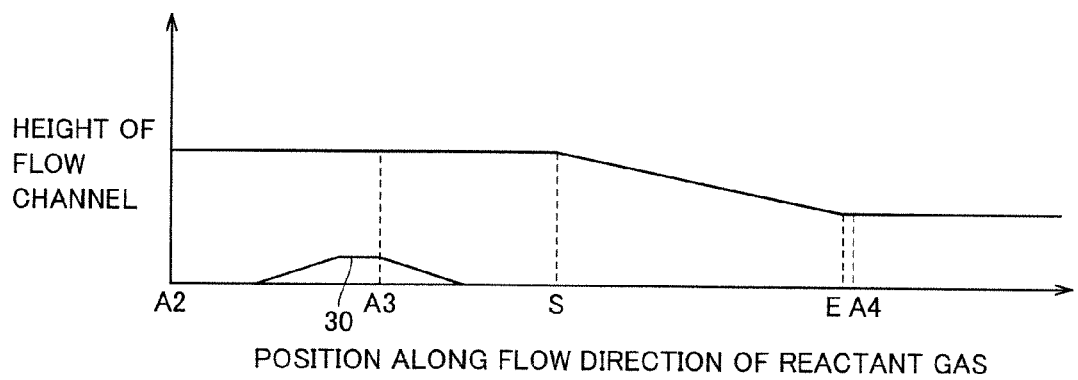
FIG. 12 is a graph showing a modification of the relation between a position along the flow direction of the reactant gas and a height of the flow channel in the third embodiment of the present invention.

Referring to FIG. 11, flow channel 11 according to the present embodiment has a bottleneck portion 30 near position A3. The height of flow channel 11 at bottleneck portion 30 is once decreased, kept constant at its local minimum value, and then increased. In FIG. 11, a top surface of flow channel 11 at bottleneck portion 30 has a convex shape. As shown in FIG. 12, however, a bottom surface of flow channel 11 at bottleneck portion 30 may have a concave shape.

With the MOCVD equipment according to the present embodiment, it is possible to increase a growth rate on the upstream side of position S and obtain the growth rate as approximately the same as the one at the downstream side of position S. As a result, it is possible to grow a uniform.

In other words, as also seen from Examples 1 and 2 of the present invention in FIG. 7, there is exhibited a three times or more difference in growth rate at the holding surface between the upstream side and the downstream side. When a film is grown in such a state with susceptor 5 rotated, the film to be formed on substrate 20 is alternately grown at a lower rate and a higher rate. It is generally known that properties (e.g. crystallinity) of the film made by epitaxial growth vary depending on is growth rate. Alternate formation of epitaxial films having different film quality tend to produce a film having non-uniform film quality in a film thickness direction.

Accordingly, in the present embodiment, the height of flow channel 11 is once decreased on the upstream side of position S, so that diffusion of the raw material on the upstream side can be promoted and the growth rate on the upstream side can be increased. Furthermore, the height of flow channel 11 is later increased, so that it is possible to suppress non-linear increase in growth rate due to promoted diffusion of the raw material. Later in a region where the growth rate is saturated, the height of flow channel 11 is decreased again, so that linear increase in growth rate can be maintained. As such, it is possible to reduce a difference in growth rate between the upstream side and the downstream side while maintaining linearity of the growth rate at the holding surface.

It is preferable that the height of flow channel 11 starts decreasing between position A2 and position A3, and then increases on the upstream side of position A3. It is also preferable that flow channel 11 maintains the same shape in the width direction thereof. Furthermore, the position of bottleneck portion 30 may be located anywhere as long as it is located on the upstream side of position S.

Figure 13:
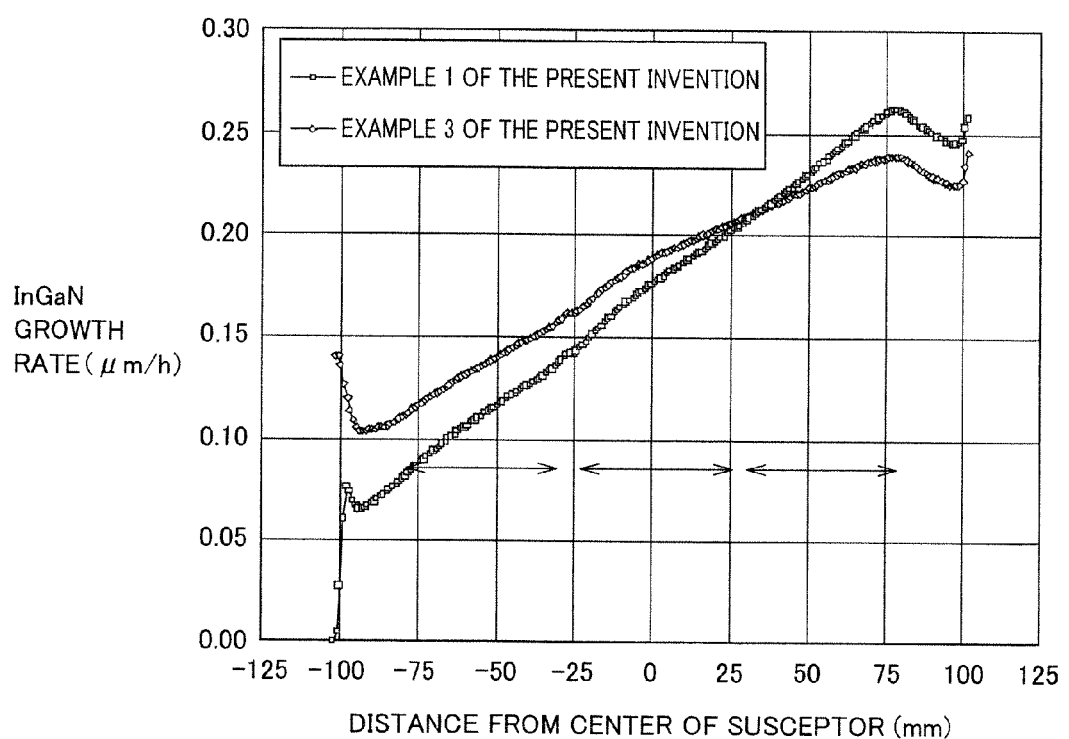
FIG. 13 is a graph showing a relation between a distance from the center of the susceptor and an InGaN growth rate when an InGaN layer is formed with the use of each of the MOCVD equipment in Example 1 of the present invention and Example 3 of the present invention.

The inventors of the present invention examined the effects of the fact that flow channel 11 has bottleneck portion 30 on the upstream side of position S. Specifically, as to the MOCVD equipment in FIG. 1, there was prepared equipment having bottleneck portion 30, as shown in FIG. 11, formed thereat (Example 3 of the present invention). This MOCVD equipment was used to form an InGaN layer on a surface of each of the six substrates held at the susceptor. There was examined the relation between a distance from the center of the susceptor and the InGaN growth rate. The results thereof are shown in FIG. 13, along with the results of Example 1 of the present invention. Note that the results in FIG. 13 are the ones along the center line (line C in FIG. 2) of the susceptor in the width direction, and a range shown by an arrow in FIG. 13 represents a position for holding the substrate at the holding surface of the susceptor.

FIG. 13 shows that Example 3 of the present invention has smaller difference in growth rate between the upstream side and the downstream side, when compared with Example 1 of the present invention. Specifically, Example 1 of the present invention has approximately 3.3 times difference in growth rate between the upstream side and the downstream side, whereas Example 3 of the present invention has approximately 2 times difference in growth rate between the upstream side and the downstream side.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Metal organic chemical vapor deposition equipment for forming a film on a substrate by using a reactant gas, comprising:
   a heating component heating said substrate and having a holding surface for holding said substrate; and
   a horizontal-type flow channel for introducing said reactant gas to said substrate, wherein:
   said heating component is rotatable with said holding surface kept facing an inner portion of said flow channel,
   a height of said flow channel along a flow direction of said reactant gas is kept constant from a position located upstream of said holding surface to an arbitrary position located above said holding surface, and said height of said flow channel along a flow direction of said reactant gas is monotonically decreased from said arbitrary position to a position located downstream of said arbitrary position, and
   a height of said flow channel along a width direction is monotonically decreased from each end portion of said holding surface to a central portion of said holding surface.

2. The metal organic chemical vapor deposition equipment according to claim 1, wherein the monotonic decrease in height of said flow channel terminates at a position located upstream of a downstream end of said substrate holding surface by 2% of a length of the holding surface in the flow direction.

3. The metal organic chemical vapor deposition equipment according to claim 1, wherein the monotonic decrease in height of said flow channel terminates at any of a position of said downstream end of said holding surface and a position located downstream of said downstream end of said holding surface.

4. The metal organic chemical vapor deposition equipment according to claim 1, wherein the height of said flow channel along the width direction is monotonically decreased in a curved manner.

5. The metal organic chemical vapor deposition equipment according to claim 1, wherein
   said flow channel has a bottleneck portion on an upstream side of said arbitrary position, and
   the height of said flow channel along the flow direction of said reactant gas at said bottleneck portion is once decreased and then increased.

6. The metal organic chemical vapor deposition equipment according to claim 1, wherein the height of said flow channel at said arbitrary position located above said holding surface is greater than the height of said flow channel at a position located downstream of said arbitrary position.

* * * * *